United States Patent
Lee et al.

(10) Patent No.: US 10,770,006 B2
(45) Date of Patent: Sep. 8, 2020

(54) DISPLAY DEVICE HAVING POWER WIRES OVERLAPPING A DRIVING INTEGRATED CIRCUIT

(71) Applicant: SAMSUNG DISPLAY CO., LTD., Yongin-si, Gyeonggi-Do (KR)

(72) Inventors: Hyun Lee, Seoul (KR); Dong Wook Kim, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 2 days.

(21) Appl. No.: 15/179,418

(22) Filed: Jun. 10, 2016

(65) Prior Publication Data
US 2017/0162126 A1    Jun. 8, 2017

(30) Foreign Application Priority Data
Dec. 3, 2015 (KR) .................. 10-2015-0171447

(51) Int. Cl.
*G09G 3/3291* (2016.01)

(52) U.S. Cl.
CPC ... *G09G 3/3291* (2013.01); *G09G 2300/0426* (2013.01); *G09G 2310/027* (2013.01); *G09G 2320/0223* (2013.01); *G09G 2330/028* (2013.01)

(58) Field of Classification Search
CPC .................................................. G09G 3/3291
USPC ....................................................... 345/212
See application file for complete search history.

(56) References Cited

U.S. PATENT DOCUMENTS

| | | | | |
|---|---|---|---|---|
| 2003/0095227 A1* | 5/2003 | Kohtaka | ............. | G02F 1/13452 349/151 |
| 2004/0212578 A1* | 10/2004 | Itou | ......... | G09G 5/006 345/100 |
| 2005/0052442 A1* | 3/2005 | Takenaka | ............ | G02F 1/13452 345/204 |
| 2005/0206600 A1* | 9/2005 | Miyasaka | ........... | G02F 1/13452 345/92 |
| 2007/0272957 A1* | 11/2007 | Johnson | ............. | H01L 29/2003 257/289 |
| 2008/0197778 A1* | 8/2008 | Kubota | ............... | H01L 27/3258 315/73 |
| 2009/0108738 A1* | 4/2009 | Kwak | .................. | G09G 3/3208 313/504 |
| 2014/0111116 A1* | 4/2014 | Shin | .................... | H01L 27/3279 315/312 |

(Continued)

FOREIGN PATENT DOCUMENTS

| | | |
|---|---|---|
| JP | 2009-208361 | 9/2009 |
| KR | 100591798 | 6/2006 |
| KR | 1020070042366 | 4/2007 |

(Continued)

*Primary Examiner* — Long D Pham
(74) *Attorney, Agent, or Firm* — F.Chau & Associates, LLC

(57) ABSTRACT

A display device includes a plurality of pixels, a driving integrated circuit (IC) configured to generate a data voltage for driving the pixels, a display substrate including a display region in which the pixels are disposed and a driving IC region in which the driving IC is disposed, and a first power wire overlapping the driving IC region, wherein the first power wire is insulated from the driving IC, and the first power wire transmits a first power-supply voltage for driving the pixels.

18 Claims, 13 Drawing Sheets

(56) References Cited

U.S. PATENT DOCUMENTS

2017/0076664 A1* 3/2017 Nakagawa ........... G09G 3/3266

FOREIGN PATENT DOCUMENTS

| KR | 1020120066410 | 6/2012 |
| KR | 1020150039254 | 4/2015 |

* cited by examiner

DISPLAY DEVICE HAVING POWER WIRES OVERLAPPING A DRIVING INTEGRATED CIRCUIT

CROSS-REFERENCE TO RELATED APPLICATION

This application claims priority under 35 U.S.C. § 119 to Korean Patent Application No. 10-2015-0171447, filed in the Korean Intellectual Property Office on Dec. 3, 2015, the disclosure of which is incorporated by reference herein in its entirety.

TECHNICAL FIELD

Exemplary embodiments of the present invention relate to a display device, and more particularly, to a display device including power wires through which a power-supply voltage for driving a plurality of pixels is transferred.

DISCUSSION OF THE RELATED ART

A liquid crystal display, an organic light emitting diode display, and the like, include a plurality of pixels to display an image. The pixels receive a power-supply voltage through power wires from a power source.

The power-supply voltage applied through the power wires may have a voltage drop because of a resistance of the power wires or the like. In this case, some of the pixels, which are disposed close to the power source, may receive the power-supply voltage at a sufficient voltage level. However, some of the pixels, which are disposed farther from the power source, may not receive the power-supply voltage at the sufficient voltage level. Accordingly, when image data having a constant gray level is input to the pixels, a luminance deviation in which luminance varies depending on positions of the pixels may occur. The luminance deviation may deteriorate display quality of a display device.

To compensate for the voltage drop of the power-supply voltage, the power-supply voltage may be transmitted at an increased voltage level through the power wires. However, in this case, power consumption of the display device may be increased.

SUMMARY

According to an exemplary embodiment of the present invention, a display device includes a plurality of pixels, a driving integrated circuit (IC) configured to generate a data voltage for driving the pixels, a display substrate including a display region in which the pixels are disposed and a driving IC region in which the driving IC is disposed, and a first power wire overlapping the driving IC region, wherein the first power wire is insulated from the driving IC, and the first power wire transmits a first power-supply voltage for driving the pixels.

In an exemplary embodiment of the present invention, the first power wire is extended from an outer circumference of the display substrate toward the display region to cross the driving IC region.

In an exemplary embodiment of the present invention, in plan view, the display substrate includes two short sides which face each other and two long sides which face each other, and the driving IC region is disposed adjacent to one of the two short sides.

In an exemplary embodiment of the present invention, the display device further includes a pad unit disposed on one of the two short sides on which the driving IC region is disposed.

In an exemplary embodiment of the present invention, the first power wire includes a first path wire connected to the pad unit and extended from the pad unit in a first direction to cross the driving IC region, a second path wire connected to the pad unit and extended from the pad unit in the first direction, wherein the second path wire does not cross the driving IC region, and a third path wire extended between the display region and the driving IC region in a second direction, wherein the third path wire is connected to the first path wire and the second path wire.

In an exemplary embodiment of the present invention, the first power wire further includes a plurality of fourth path wires extended from the display region in the first direction and connected to the third path wire, and a plurality of fifth path wires extended from the display region in the second direction and connected to the fourth path wires.

In an exemplary embodiment of the present invention, the display device further includes a second power wire overlapping the driving IC region, wherein the second power wire is insulated from the driving IC, and the second power wire transmits a second power-supply voltage to drive the pixels.

In an exemplary embodiment of the present invention, the second power wire includes a sixth path wire connected to a two first connections of the pad unit, wherein the sixth path wire is disposed adjacent to a wiring path including the first path wire, the third path wire, and the second path wire.

In an exemplary embodiment of the present invention, the sixth path wire crosses the driving IC region adjacent to the first path wire.

In an exemplary embodiment of the present invention, the second power wire further includes a seventh path wire connected to a two second connections of the pad unit, wherein the seventh path wire is disposed along an outer circumference of the display region.

In an exemplary embodiment of the present invention, the driving IC includes a plurality of input bumpers arranged in the second direction, plurality of output bumpers arranged in the second direction, and an IC body disposed on the display substrate to be supported by the input bumpers and the output bumpers. The IC body includes a data line region and a power line region in the second direction, the input bumpers and the output bumpers are disposed in the data line region, and the power line region corresponds to a region in which the first path wire and the sixth path wire are disposed.

In an exemplary embodiment of the present invention, the first path wire and the sixth path wire have a lower height than that of a space between the IC body and the display substrate.

In an exemplary embodiment of the present invention, the display device further includes an insulating layer covering the first path wire and the sixth path wire.

According to an exemplary embodiment of the present invention, a display device includes a display substrate, a first power wire disposed on the display substrate, a plurality of input bumpers disposed on the display substrate, a plurality of output bumpers disposed on the display substrate, and an integrated circuit (IC) body disposed on the first power wire and supported by the input bumpers and the output bumpers.

In an exemplary embodiment of the present invention, the display device further includes a second power wire disposed on the display substrate, wherein the IC body is disposed on the second power wire.

In an exemplary embodiment of the present invention, a space between the IC body and the display substrate corresponds to a height of the input bumpers and the output bumpers, and a height of the first power wire and the second power wire is lower than that of the space between the IC body and the display substrate.

In an exemplary embodiment of the present invention, the display device further includes an insulating layer covering the first power wire and the second power wire, wherein the insulating layer insulates the first power wire, the second power wire, and the IC body from each other.

In an exemplary embodiment of the present invention, the display device further includes a first power input bumper connected to the first power wire, a first power output bumper connected to the first power wire, and a first power connection wire disposed under or in the IC body to connect the first power input bumper and the first power output bumper.

In an exemplary embodiment of the present invention, the display device further includes a second power input bumper connected to the second power wire, a second power output bumper connected to the second power wire, and a second power connection wire disposed under or in the IC body to connect the second power input bumper and the second power output bumper.

In an exemplary embodiment of the present invention, the first power wire is disconnected in a region between the first power input bumper and the first power output bumper, and the second power wire is disconnected in a region between the second power input bumper and the second power output bumper.

According to an exemplary embodiment of the present invention, a display device includes a plurality of pixels. A driving integrated circuit (IC) is configured to generate a data voltage for driving the pixels. A display substrate includes a display region and a driving IC region, wherein the pixels are disposed in the display region and the driving IC is disposed in the driving IC region. The first power wire is insulated from the driving IC, and the first power wire transmits a first power-supply voltage for driving the pixels.

DETAILED DESCRIPTION OF THE EMBODIMENTS

Figure 1:
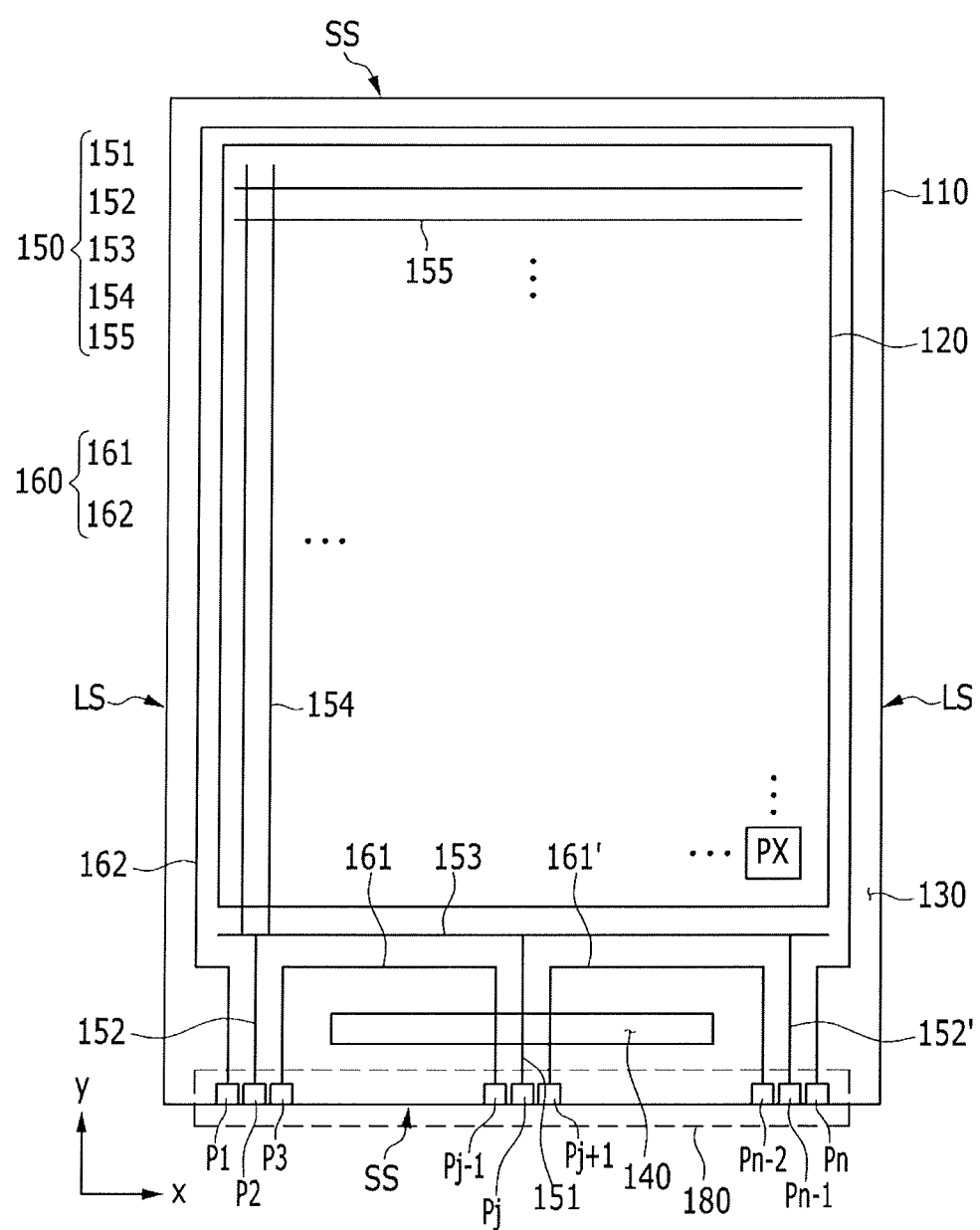
FIG. 1 is a top plan view of a display device according to an exemplary embodiment of the present invention.

The present invention will become more apparent by describing in detail exemplary embodiments thereof with reference to the accompanying drawings. The described embodiments may be modified in various different ways, and thus, should not be limited to the embodiments set forth herein.

Further, like reference numerals may refer to like elements throughout the specification. A duplicate description of elements already described may be omitted for brevity.

Throughout this specification and the claims that follow, when it is described that an element is "coupled" or "connected" to another element, the element may be "directly coupled" or "directly connected" to the other element or "electrically coupled" or "electrically connected" to the other element through a third element.

A display device according to an exemplary embodiment of the present invention will be described in detail with reference to FIG. 1.

FIG. 1 is a top plan view of a display device according to an exemplary embodiment of the present invention.

Referring to FIG. 1, the display device includes a display substrate 110, a plurality of pixels PX disposed on the display substrate 110, first power wires 150 and second power wires 160 disposed on the display substrate 110, and a pad unit 180 connected to the first power wires 150 and the second power wires 160.

The display substrate 110 may be divided into a display region 120 and a non-display region 130. The non-display region 130 includes a driving integrated circuit (IC) region 140. The display region 120 in which the pixels PX are disposed may display an image. The non-display region 130 is a region surrounding the display region 120. For example, the non-display region 130 is disposed adjacent to one or more sides of the display region 120. The driving IC region 140 is a region at which a driving IC (refer to FIG. 2 or FIG. 4) for driving the pixels PX is disposed. A driving IC 200 illustrated in FIG. 2 or FIG. 4 may be disposed in the driving IC region 140. In this case, a size of the driving IC region 140 may be identical to that of an IC body 240 of the driving IC 200. The driving IC region 140 may be disposed in the non-display region 130. Further, the driving IC region 140 may be disposed adjacent to the display region 120.

The display substrate 110 may include two short sides SS which face each other and two long sides LS which face each other in a plan view. For example, the display substrate 110 may be a quadrangular substrate. In this case, the driving IC region 140 may be disposed adjacent to one of the short sides SS.

Hereinafter, a direction parallel to the long sides LS of the display substrate 110 is referred to as a first direction y, and a direction parallel to the short sides SS of the display substrate 110 is referred to as a second direction x. The second direction x may be perpendicular to the first direction y. For convenience of description, the first direction y may be referred to as a vertical direction, and the second direction x may be referred to as a horizontal direction.

The pad unit 180 is disposed close to the short side SS of the display substrate 110 on which the driving IC region 140 is disposed. The driving IC region 140 is interposed between the pad unit 180 and the display region 120.

The pad unit 180 includes a plurality of connection pads P1, P2, P3, P(j−1), Pj, P(j+1), P(n−2), P(n−1), and Pn disposed in a row at the short side SS on which the driving IC region 140 is disposed. For example, the connection pads P1, P2, P3, P(j−1), Pj, P(j+1), P(n−2), P(n−1), and Pn, may be disposed in a row from left to right along the short side SS on which the driving IC region 140 is disposed.

The pad unit 180 may be connected to a flexible printed circuit board (FPCB), and receives a first power-supply voltage and a second power-supply voltage through the FPCB from an external power source. The first power-supply voltage and the second power-supply voltage are respectively transmitted to the first power wires 150 and the second power wires 160 through the pad unit 180.

The first power wires 150 may transmit the first power-supply voltage to drive the pixels PX. The second power wires 160 may transmit the second power-supply voltage to drive the pixels PX. The first power-supply voltage may be a high level voltage, and the second power-supply voltage may be a low level voltage that is lower than that of the first power-supply voltage.

The first power wires 150 include a first path wire 151, second path wires 152 and 152', a third path wire 153, a fourth path wire 154, and a fifth path wire 155.

The first path wire 151 includes a first end thereof connected to the $j^{th}$ connection pad Pj and a second end thereof connected to the third path wire 153. The first power-supply voltage is applied to the $j^{th}$ connection pad Pj. The first path wire 151 is extended from the $j^{th}$ connection pad Pj in the first direction y to overlap the driving IC region 140, and may cross the driving IC region 140. The first path wire 151 may be extended in the first direction y to cross a center of the driving IC region 140. In other words, the first path wire 151 is extended from an outer circumference of the display substrate 110, e.g., from the short side SS on which the driving IC region 140 is disposed, toward the display region 120 to cross the driving IC region 140. A part of the first path wire 151 may be disposed to overlap the driving IC region 140. Herein, the word "overlap" may refer to an overlap along a direction that is perpendicular to a plane in which the display substrate 110 extends.

The second path wires 152 and 152' include a left-side second path wire 152 disposed at a left side of the driving IC region 140 and a right-side second path wire 152' disposed at a right side of the driving IC region 140 in the non-display region 130. The left-side second path wire 152 includes a first end thereof connected to a second connection pad P2 and a second end thereof connected to the third path wire 153. The first power-supply voltage is applied to the second connection pad P2. The left-side second path wire 152 is extended from the second connection pad P2 in the first direction y to be connected to the third path wire 153.

The right-side second path wire 152' includes a first end thereof connected to the $(n−1)^{th}$ connection pad P(n−1) and a second end thereof connected to the third path wire 153. The first power-supply voltage is applied to the $(n−1)^{th}$ connection pad P(n−1). The right-side second path wire 152' is extended from the $(n−1)^{th}$ connection pad P(n−1) in the first direction y to be connected to the third path wire 153.

The second path wires 152 and 152' are extended beyond opposite sides of the driving IC region 140 in the first direction y to be connected to the third path wire 153, instead of crossing the driving IC region 140. Accordingly, the second path wires 152 and 152' are not disposed in the driving IC region 140.

The third path wire 153 is disposed in the non-display region 130 along a side of the display region 120. In other words, the third path wire 153 is extended in the second direction x between the display region 120 and the driving IC region 140. The third path wire 153 is connected to the first path wire 151 and the second path wires 152 and 152'.

The fourth path wire 154 includes a first end thereof connected to the third path wire 153 and is extended in the first direction y in the display region 120. In the display region 120, the fourth path wire 154 includes a plurality of fourth path wires 154. The fourth path wires 154 may be arranged in the display region 120 at a predetermined distance in the second direction x.

The fifth path wire 155 is extended in the second direction x in the display region 120. In the display region 120, the fifth path wire 155 includes a plurality of fifth path wires 155, and the fifth path wires 155 may be arranged in the display region 120 at a predetermined distance in the first direction y.

The fourth path wires 154 and the fifth path wires 155 may be connected to each other at a position where they intersect each other. Accordingly, in the display region 120, the fourth path wires 154 and the fifth path wires 155 may be connected to each other to form a wiring pattern that has a mesh shape.

The pixels PX disposed in the display region 120 may be connected to at least one of the fourth path wires 154 and the fifth path wires 155 to receive the first power-supply voltage.

The second power wires 160 include sixth path wires 161 and 161' and a seventh path wire 162.

The sixth path wires 161 and 161' include a left-side sixth path wire 161 disposed at the left side of the first path wire 151 and a right-side sixth path wire 161' disposed at the right side of the first path wire 151.

The left-side sixth path wire 161 includes a first end thereof connected to the third connection pad P3 and a second end thereof connected to the $(j−1)^{th}$ connection pad P(j−1). The second power-supply voltage is applied to the third connection pad P3 and the $(j−1)^{th}$ connection pad P(j−1). The left-side sixth path wire 161 in the left side is disposed adjacent to a wiring path including the first path wire 151, the third path wire 153, and the left-side second path wire 152.

The right-side sixth path wire 161' includes a first end thereof connected to the $(j+1)^{th}$ connection pad P(j+1) and a second end thereof connected to the $(n−2)^{th}$ connection pad P(n−2). The second power-supply voltage is applied to the $(j+1)^{th}$ connection pad P(j+1) and the $(n−2)^{th}$ connection pad P(n−2). The right-side sixth path wire 161' is disposed adjacent to a wiring path including the first path wire 151, the third path wire 153, and the right-side second path wire 152'.

The sixth path wires 161 and 161' cross the driving IC region 140 at the left and right sides of the first path wire 151, respectively, along a direction in which the first path wire 151 extends. Accordingly, parts of the sixth path wires 161 and 161' are disposed in the driving IC region 140.

The seventh path wire 162 includes a first end thereof connected to the first connection pad P1 and a second end thereof connected to the $n^{th}$ connection pad Pn. The second power-supply voltage is applied to the first connection pad P1 and the $n^{th}$ connection pad Pn. The seventh path wire 162 is disposed along the outer circumference of the display region 120 except for portions at which the sixth path wires 161 and 161' are disposed.

The pixels PX disposed in the display region 120 may include an electrode formed of a transparent conductor, and the electrode formed of the transparent conductor may be connected to at least one of the sixth path wires 161 and 161' and the seventh path wire 162 disposed along the outer circumference of the display region 120 to receive the second power-supply voltage.

Hereinafter, a driving IC 200 mounted on the display substrate 110 on which the first power wires 150 and the second power wires 160 are disposed will be described with reference to FIG. 2 and FIG. 3.

Figure 2:
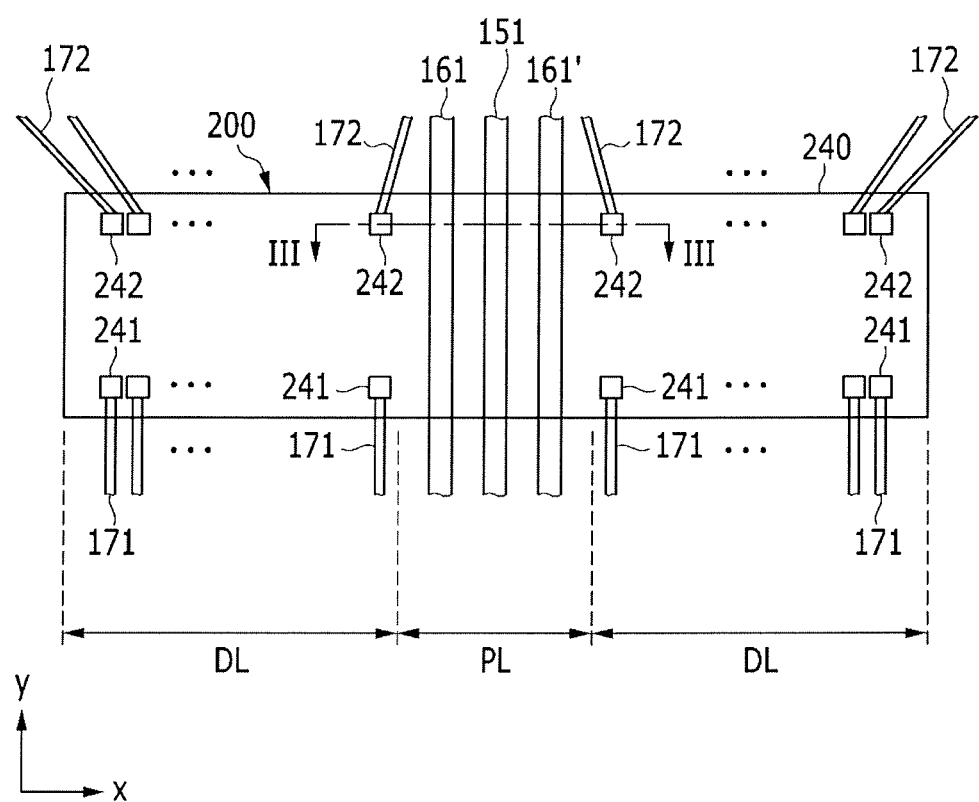
FIG. 2 is a block diagram illustrating a driving integrated circuit (IC) and power wires employed in a display device according to an exemplary embodiment of the present invention.

FIG. 2 is a block diagram illustrating a driving IC 200 and power wires in a display device according to an exemplary embodiment of the present invention. FIG. 3 is a cross-sectional view taken along line III-III of FIG. 2, illustrating the driving IC and the power wires of FIG. 2, according to an exemplary embodiment of the present invention. Cross-sections of a plurality of input bumpers 241, the first path wire 151, and the sixth path wires 161 and 161' may be formed in an identical manner to that of FIG. 3.

Figure 3:
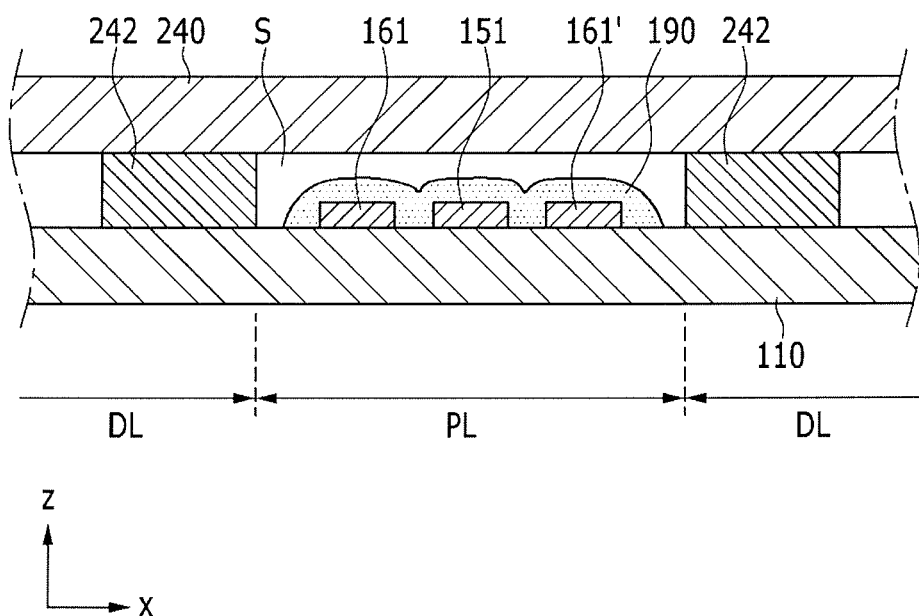
FIG. 3 is a cross-sectional view taken along line of FIG. 2, illustrating the driving IC and the power wires of FIG. 2, according to an exemplary embodiment of the present invention.

Referring to FIG. 2 and FIG. 3, the driving IC 200 includes the IC body 240, a plurality of input bumpers 241, and a plurality of output bumpers 242.

The input bumpers 241 are respectively connected to a plurality of input wires 171. The input wires 171 may connect the pad unit 180 and the input bumpers 241 of the driving IC 200 to each other. An image data signal is inputted to the IC body 240 through the pad unit 180, the input wires 171, and the input bumpers 241. The input bumpers 241 are disposed on the display substrate 110 to support the IC body 240.

The output bumpers 242 are respectively connected to a plurality of output wires 172. The output wires 172 may connect a plurality of data lines disposed in the display region 120 and the output bumpers 242 of the driving IC 200 to each other. The data lines are connected to the pixels PX. The output bumpers 242 are disposed on the display substrate 110 to support the IC body 240.

The IC body 240 generates a data voltage corresponding to a level of the image data signal by processing the image data signal. The IC body 240 may include a driving circuit configured to generate the data voltage corresponding to the level of the image data signal. The IC body 240 outputs the generated data voltage through the output bumpers 242. The data voltage is transmitted to the pixels PX through the output bumpers 242, the output wires 172, and the data lines.

The IC body 240 may be divided into a data line region DL and a power line region PL in the second direction x.

The input bumpers 241 and the output bumpers 242 are disposed in the data line region DL. In the data line region DL, the input bumpers 241 may be arranged at a predetermined distance in the second direction x. In the data line region DL, the output bumpers 242 may be arranged at a predetermined distance in the second direction x.

The power line region PL corresponds to a region in which the first power wires 150 and the second power wires 160 crossing the driving IC region 140 are disposed. For example, the power line region PL corresponds to a region in which the first path wire 151 and the sixth path wires 161 and 161' crossing the driving IC region 140 are disposed. The input bumpers 241 and the output bumpers 242 are not disposed in the power line region PL. However, in the power line region PL, a plurality of dummy bumpers may be disposed to be arranged in series like the input bumpers 241 or the output bumpers 242. In other words, the dummy bumpers may be arranged along a line. In this case, the dummy bumpers are electrically insulated from the first path wire 151 and the sixth path wires 161 and 161'.

The IC body 240 is disposed on the display substrate 110 to be supported by the input bumpers 241 and the output bumpers 242. Accordingly, a space S is formed to correspond to heights of the input bumpers 241 and the output bumpers 242 in a third direction z between the IC body 240 and the display substrate 110. The third direction z is perpendicular to the second direction x. The first path wire 151 and the sixth path wires 161 and 161' disposed on the display substrate 110 are formed to have a lower height than that of the space S formed in the power line region PL. The height of the first path wire 151 and the sixth path wires 161 and 161' refers to their width in the third direction z. An insulating layer 190 is disposed on the first path wire 151 and the sixth path wires 161 and 161' to cover the first path wire 151 and the sixth path wires 161 and 161'. The insulating layer 190 electrically insulates the driving IC 200, the first path wire 151, and the sixth path wires 161 and 161'. The insulating layer 190 may be formed of an organic insulating layer or an inorganic insulating layer. In the space S between the IC body 240 and the display substrate 110, air or the like may be filled in a remaining portion excluding portions occupied by the first path wire 151, the sixth path wires 161 and 161', and the insulating layer 190.

As such, on the display substrate 110, the first power wires 150 and the second power wires 160 passing through the driving IC region 140 are electrically insulated from the driving IC 200.

Hereinafter, the driving IC 200 disposed on the driving IC region 140, and the first power wires 150 and the second power wires 160 disposed to cross the driving IC region 140 according to an exemplary embodiment of the present invention will be described with reference to FIG. 4 and FIG. 5. Differences between FIG. 2 and FIG. 3, and FIG. 4 and FIG. 5 will be mainly described below.

Figure 4:
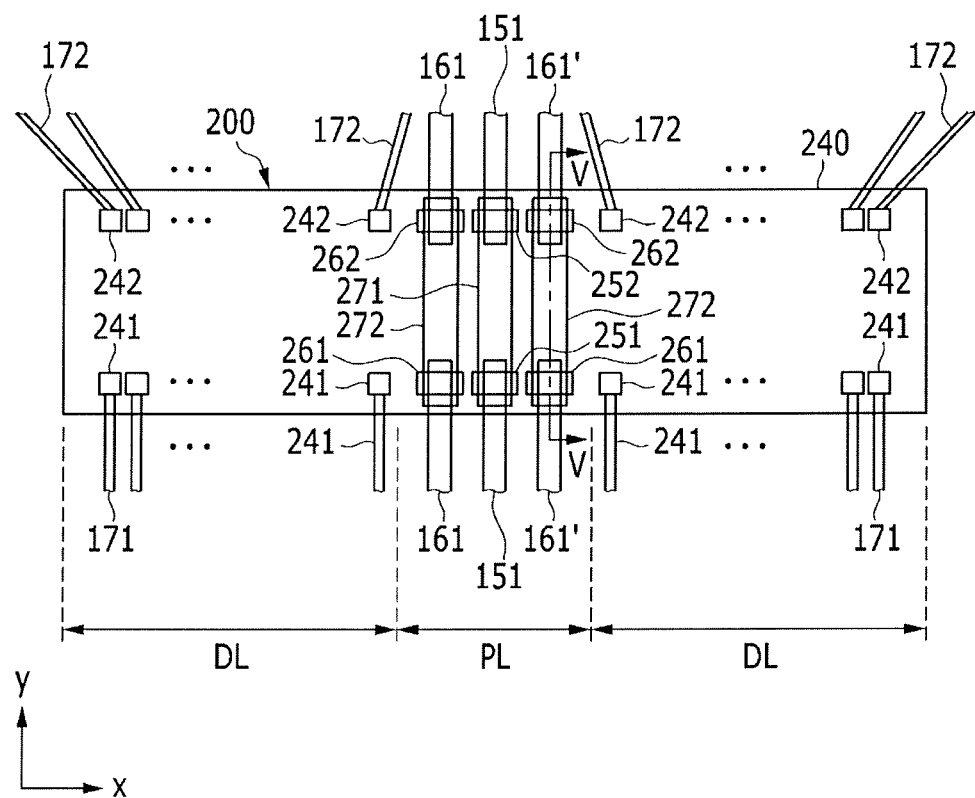
FIG. 4 is a block diagram illustrating a driving IC and power wires employed in a display device according to an exemplary embodiment of the present invention.

FIG. 4 is a block diagram illustrating a driving IC 200 and power wires employed in a display device according to an exemplary embodiment of the present invention. FIG. 5 is a cross-sectional view taken along line V-V in FIG. 4, illustrating the driving IC and the power wires of FIG. 4, according to an exemplary embodiment of the present invention. The cross-sections of a first power input bumper 251, a first power connection wire 271, and a first power output bumper 252 may be formed in an identical manner to that of FIG. 5.

Figure 5:
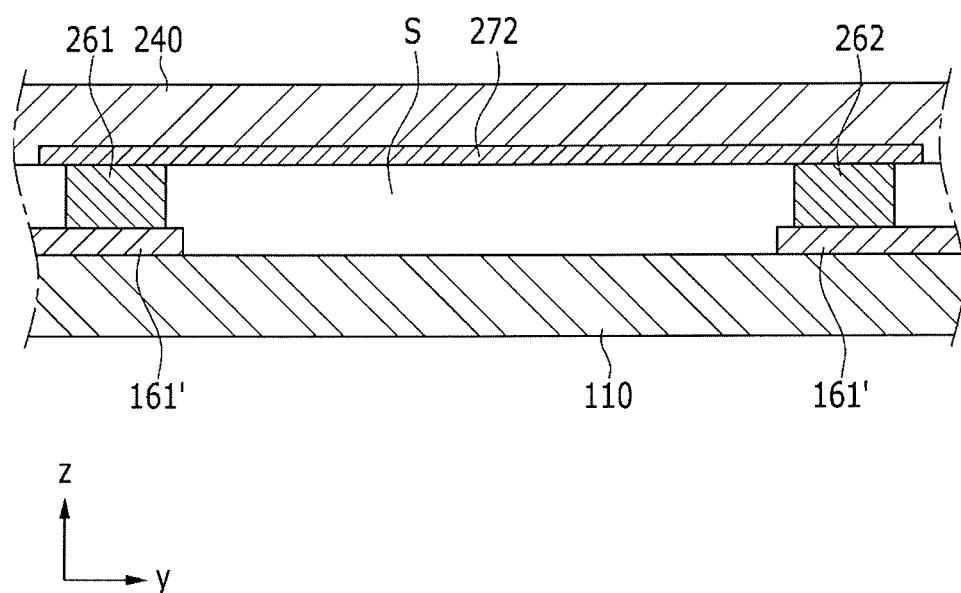
FIG. 5 is a cross-sectional view taken along line V-V in FIG. 4, illustrating the driving IC and the power wires of FIG. 4, according to an exemplary embodiment of the present invention.

Referring to FIG. 4 and FIG. 5, a driving IC 200 includes an IC body 240, input bumpers 241, output bumpers 242, dummy bumpers, and bumper connection wires. The dummy bumpers are unrelated to inputting of the image data signal and outputting of the data voltage of the driving IC 200.

The dummy bumpers include a first power input bumper 251, a first power output bumper 252, a second power input bumper 261, and a second power output bumper 262. The first power input bumper 251, the first power output bumper 252, the second power input bumper 261, and the second power output bumper 262 are disposed in a power line region PL.

The first power input bumper 251 and the first power output bumper 252 are disposed on the first path wire 151 and are electrically connected to the first path wire 151. Herein, in the driving IC region 140, the first path wire 151 may not be disposed in a region corresponding to a region between the first power input bumper 251 and the first power output bumper 252. In other words, the first path wire 151 may be disposed from outside of the driving IC region 140 to regions corresponding to the first power input bumper 251 and the first power output bumper 252. For example, the first path wire 151 may not extend between the first power input bumper 251 and the first power output bumper 252. Accordingly, the first path wire 151 may be disconnected in the driving IC region 140.

The second power input bumper 261 includes second power input bumpers 261 that are respectively disposed at left and right sides of the first power input bumper 251. The second power output bumper 262 includes second power output bumpers 262 that are respectively disposed at left and right sides of the first power output bumper 252. The second power input bumpers 261 and the second power output bumpers 262 are disposed on the sixth path wires 161 and 161', and are electrically connected to the sixth path wires 161 and 161'. Herein, in the driving IC region 140, the sixth path wires 161 and 161' may not be disposed in a region corresponding to a region between the second power input bumpers 261 and the second power output bumpers 262. In other words, the sixth path wires 161 and 161' may be disposed from the outside of the driving IC region 140 to regions corresponding to the second power input bumpers 261 and the second power output bumpers 262. For example, the sixth path wires 161 and 161' may not extend between the second power input bumpers 261 and the second power output bumpers 262 Accordingly, the sixth path wires 161 and 161' may be disconnected in the driving IC region 140.

The bumper connection wires include a first power connection wire 271 and a second power connection wire 272. The first power connection wire 271 and the second power connection wire 272 may be disposed under or in the IC body 240 in the power line region PL. Although disposed under or in the IC body 240, the first power connection wire 271 and the second power connection wire 272 are electrically insulated from the driving circuit of the driving IC 200.

The first power connection wire 271 connects the first power input bumper 251 and the first power output bumper 252 to each other. The second power connection wire 272 includes second power connection wires 272 which are respectively disposed at left and right sides of the first power connection wire 271 to connect the second power input bumpers 261 and the second power output bumpers 262 to each other.

As such, the first path wire 151, disconnected in the driving IC region 140, may be connected by the first power input bumper 251, the first power connection wire 271, and the first power output bumper 252. Further, the sixth path wires 161 and 161', disconnected in the driving IC region 140, may be connected by the second power input bumpers 261, the second power connection wires 272, and the second power output bumpers 262.

The first power connection wire 271 is electrically insulated from the driving circuit of the driving IC 200 and is connected to the first path wire 151 to transmit the first power-supply voltage. The second power connection wires 272 are electrically insulated from the driving circuit of the driving IC 200 and are connected to the sixth path wires 161 and 161' to transmit the second power-supply voltage. Accordingly, the first power connection wire 271 and the second power connection wires 272 may be parts of the first power wires 150 and the second power wires 160, respectively. Accordingly, the first power wires 150 may be extended through the first power connection wire 271 to cross the driving IC region 140 to transmit the first power-supply voltage, and the second power wires 160 may be extended through the second power connection wires 272 to cross the driving IC region 140 to transmit the second power-supply voltage.

Although in FIGS. 4 and 5, the first path wire 151 and the sixth path wires 161 and 161' have been described to be disconnected in the driving IC region 140, the first path wire 151 and the sixth path wires 161 and 161' may not be disconnected in the driving IC region 140 and may be extended in the first direction y to be respectively connected to the first power connection wire 271 and the second power connection wires 272 as shown in FIG. 2. In other words, opposite ends of the first path wire 151 may be connected to each other through the first power connection wire 271. Opposite ends the sixth path wires 161 and 161', respectively, may be connected to each other through the second power connection wires 272.

Hereinafter, a display device according to an exemplary embodiment of the present invention will be described with reference to FIG. 6. Differences between FIG. 1 and FIG. 6 will be mainly described below.

Figure 6:
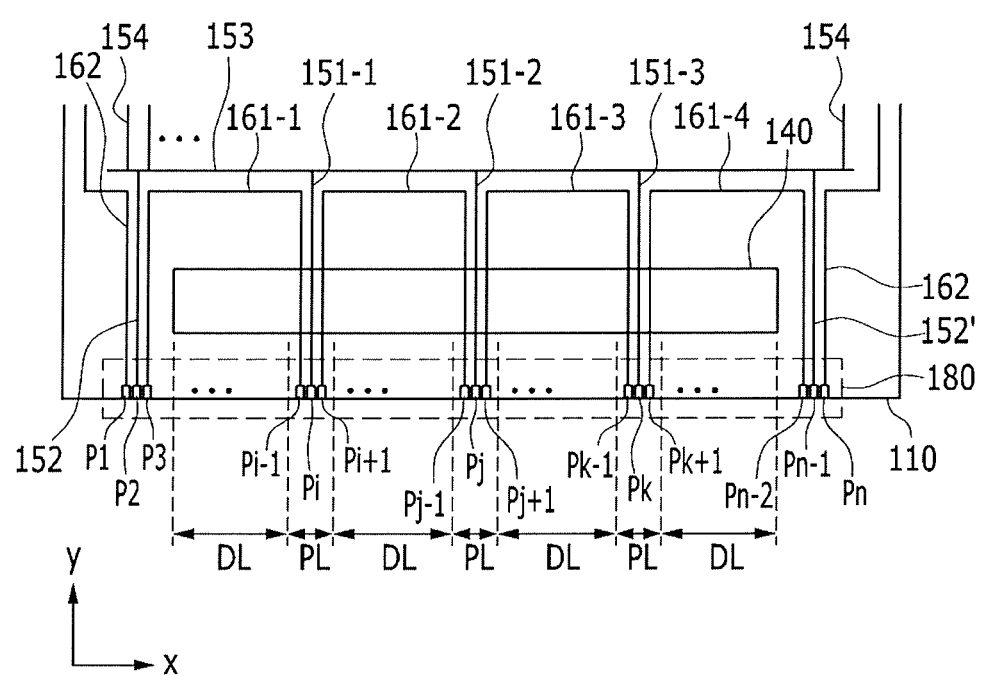
FIG. 6 is a top plan view of a display device according to an exemplary embodiment of the present invention.

FIG. 6 is a top plan view of a display device according to an exemplary embodiment of the present invention.

In comparison with FIG. 1, in FIG. 6 the first power wires 150 include three first path wires 151-1, 151-2, and 151-3, and the second power wires 160 include four sixth path wires 161-1, 161-2, 161-3, and 161-4. The pad unit 180 includes a greater number of connection pads P1, P2, P3, P(i−1), Pi, P(i+1), P(j−1), Pj, P(j+1), P(k−1), Pk, P(k+1), P(n−2), P(n−1), and Pn connected to the first power wires 150 or the second power wires 160.

The first path wire 151-2 disposed at a center may include a first end thereof connected to the $j^{th}$ connection pad Pj and a second end thereof connected to the third path wire 153. The central first path wire 151-2 is extended from the $j^{th}$ connection pad Pj in the first direction y to cross the driving IC region 140.

The left-side first path wire 151-1, disposed at a left side of the first path wire 151-2, includes a first end thereof connected to the connection pad Pi and a second end thereof connected to the third path wire 153. The left-side first path wire 151-1 is extended from the $i^{th}$ connection pad Pi in the first direction y across the driving IC region 140.

The right-side first path wire 151-3, disposed at a right side of the first path wire 151-2, includes a first end thereof connected to the $k^{th}$ connection pad Pk and a second end thereof connected to the third path wire 153. The right-side first path wire 151-3 is extended from the $k^{th}$ connection pad Pk in the first direction y to cross the driving IC region 140.

The first power-supply voltage is applied to the $i^{th}$ connection pad Pi, the $j^{th}$ connection pad Pj, and the $k^{th}$ connection pad Pk.

The sixth path wire 161-1, disposed between the left-side second path wire 152 and the left-side first path wire 151-1, includes a first end thereof connected to the third connection pad P3 and a second end thereof connected to the $(i-1)^{th}$ connection pad P(i−1). The sixth path wire 161-1 is disposed adjacent to a wiring path including the left-side second path wire 152, the third path wire 153, and the left-side first path wire 151-1.

The sixth path wire 161-2, disposed between the left-side first path wire 151-1 and the central first path wire 151-2, includes a first end thereof connected to the $(i+i)^{th}$ connection pad P(i+1) and a second end thereof connected to the $(j-1)^{th}$ connection pad P(j−1). The sixth path wire 161-2 is disposed adjacent to a wiring path including the left-side first path wire 151-1, the third path wire 153, and the central first path wire 151-2.

The sixth path wire 161-3, disposed between the central first path wire 151-2 and the right-side first path wire 151-3, includes a first end thereof connected to the $(j+i)^{th}$ connection pad P(j+1) and a second end thereof connected to the $(k-1)^{th}$ connection pad P(k−1). The sixth path wire 161-3 is disposed adjacent to a wiring path including the central first path wire 151-2, the third path wire 153, and the right-side first path wire 151-3.

The sixth path wire 161-4, disposed between the right-side first path wire 151-3 and the right-side second path wire 152', includes a first end thereof connected to the $(k+1)^{th}$ connection pad P(k+1) and a second end thereof connected to the $(n-2)^{th}$ connection pad P(n−2). The sixth path wire 161-4 is disposed adjacent to a wiring path including the right-side first path wire 151-3, the third path wire 153, and the right-side second path wire 152'.

The second power-supply voltage is applied to the third connection pad P3, the $(i-1)^{th}$ connection pad P(i−1), the $(i+1)^{th}$ connection pad P(i+1), the $(j-1)^{th}$ connection pad P(j−1), the $(j+1)^{th}$ connection pad P(j+1), the $(k-1)^{th}$ connection pad P(k−1), the $(k+1)^{th}$ connection pad P(k+1), and the $(n-2)^{th}$ connection pad P(n−2).

As described above, the greater number of first path wires 151-1, 151-2, and 151-3 serving to transmit the first power-supply voltage and the greater number of sixth path wires 161-1, 161-2, 161-3, and 161-4 serving to transmit the second power-supply voltage may be disposed on the display substrate 110. The driving IC 200 of FIG. 6 may include three power line regions PL to correspond to the first path wires 151-1, 151-2, and 151-3 and the sixth path wires 161-1, 161-2, 161-3, and 161-4. In the three power line regions PL, a structure of the driving IC 200 may be identical to that of FIG. 2 or FIG. 4. Accordingly, a detailed description of the structure of the driving IC 200 at the three power line regions PL may be omitted for brevity.

Figure 7:
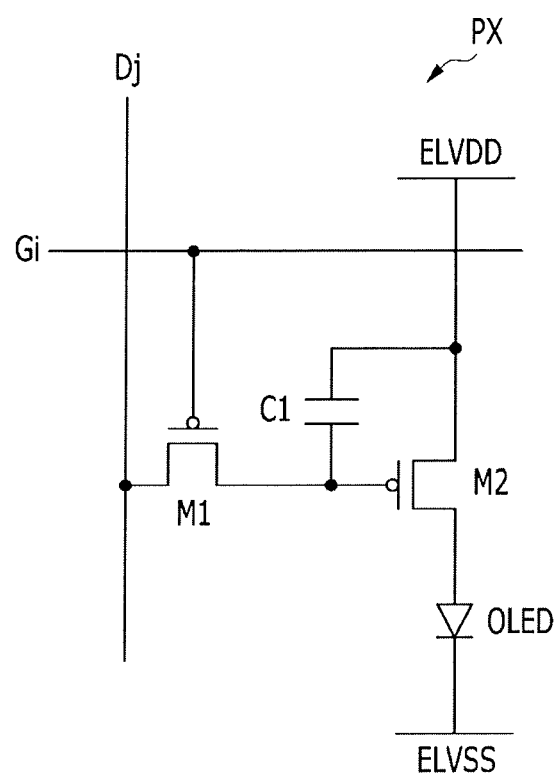
FIG. 7 is a circuit diagram illustrating a pixel according to an exemplary embodiment of the present invention.

FIG. 7 is a circuit diagram illustrating a pixel according to an exemplary embodiment of the present invention. The pixel is one of the pixels PX included in the display device of FIG. 1.

Referring to FIG. 7, the pixel PX includes a switching transistor M1, a driving transistor M2, a storage capacitor C1, and an organic light emitting diode (OLED).

The switching transistor M1 includes a gate electrode connected to a gate line Gi, a first electrode connected to a data line Dj, and a second electrode connected to the driving transistor M2. The switching transistor M1 is turned on by a gate signal of a gate-on voltage applied to the gate line Gi, and transmits the data voltage applied to the data line Dj to the driving transistor M2.

The driving transistor M2 includes a gate electrode connected to the second electrode of the switching transistor M1, a first electrode connected to a first power-supply voltage ELVDD, and a second electrode connected to the organic light emitting diode OLED. The driving transistor M2 controls a driving current flowing from the first power-supply voltage ELVDD to the organic light emitting diode OLED depending on the data voltage applied to the gate electrode thereof.

The storage capacitor C1 includes a first electrode connected to the first power-supply voltage ELVDD and a second electrode connected to the gate electrode of the driving transistor M2. The storage capacitor C1 stores a gate voltage of the driving transistor M2.

The organic light emitting diode OLED includes an anode connected to the second electrode of the driving transistor M2 and a cathode connected to a second power-supply voltage ELVSS. The organic light emitting diode OLED may emit light of one of the primary colors. For example, the light emitted from the organic light emitting diode OLED has a luminance corresponding to the driving current flowing in the driving transistor M2.

For example, the primary colors may be three primary colors of red, green, and blue. a desired color may be displayed by a spatial or temporal sum of the three primary colors. In the present exemplary embodiment, the primary colors are described as red, green, and blue, but they are not limited thereto. The pixels PX may emit light of one of primary colors such as yellow, cyan, magenta, and the like. Alternatively, the pixels may emit white light or a combined color of the primary colors.

The above-described first power wires 150 transmit the first power-supply voltage ELVDD applied to the pixels PX, and the second power wires 160 transmit the second power-supply voltage ELVSS applied to the pixels PX.

According to an exemplary embodiment of the present invention, a pixel PX may have a structure as illustrated in FIG. 7. However, exemplary embodiments of the present invention are not limited to the structure of the pixel PX illustrated in FIG. 7. For example, a display device may have various structures of the pixel PX.

Hereinafter, a result of simulation testing of a voltage drop of the first power-supply voltage, a voltage drop of the second power-supply voltage, and a luminance deviation in the case that the first power wires 150 and the second power wires 160 are disposed to cross the driving IC region 140, as in the exemplary embodiment of the present invention described with reference to FIG. 1, will be described with reference to FIG. 8 to FIG. 10. Further, a result of simulation testing of a voltage drop of the first power-supply voltage, a voltage drop of the second power-supply voltage, and a luminance deviation in the case of a comparative example in which the first power wires 150 and the second power wires 160 are disposed to not cross the driving IC region 140 will be described with reference to FIG. 11 to FIG. 13.

Figure 8:
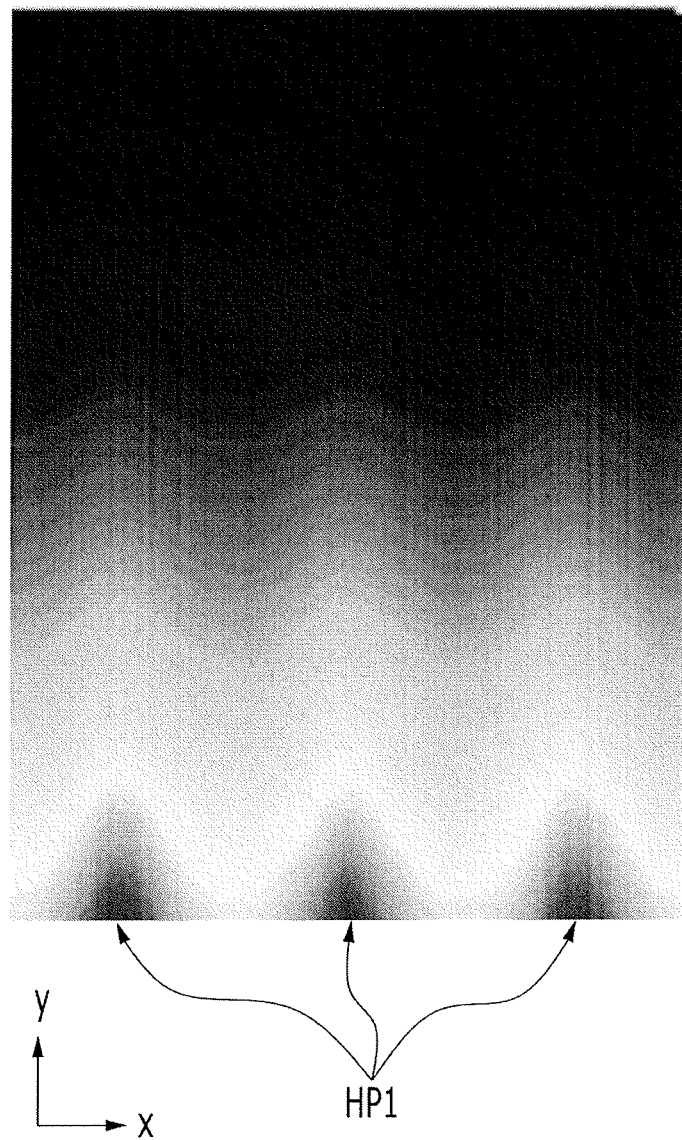
FIG. 8 shows a result of simulation testing of a voltage drop of a first power-supply voltage in a display device according to an exemplary embodiment of the present invention.

FIG. 8 shows a result of simulation testing of a voltage drop of the first power-supply voltage in the display device according to an exemplary embodiment of the present invention. FIG. 8 shows a result of measuring a level of the first power-supply voltage in an entire portion of the display region 120.

Referring to FIG. 8, it can be seen that the level of the first power-supply voltage is high in a region HP1 where the first path wire 151 and the second path wires 152 and 152' are disposed, and the level of the first power-supply voltage decreases further away from the region HP1 where the first path wire 151 and the second path wires 152 and 152' are disposed.

The voltage drop of the first power-supply voltage, as a difference between a maximum level and a minimum level, was measured to be about 0.1570 V.

Figure 9:
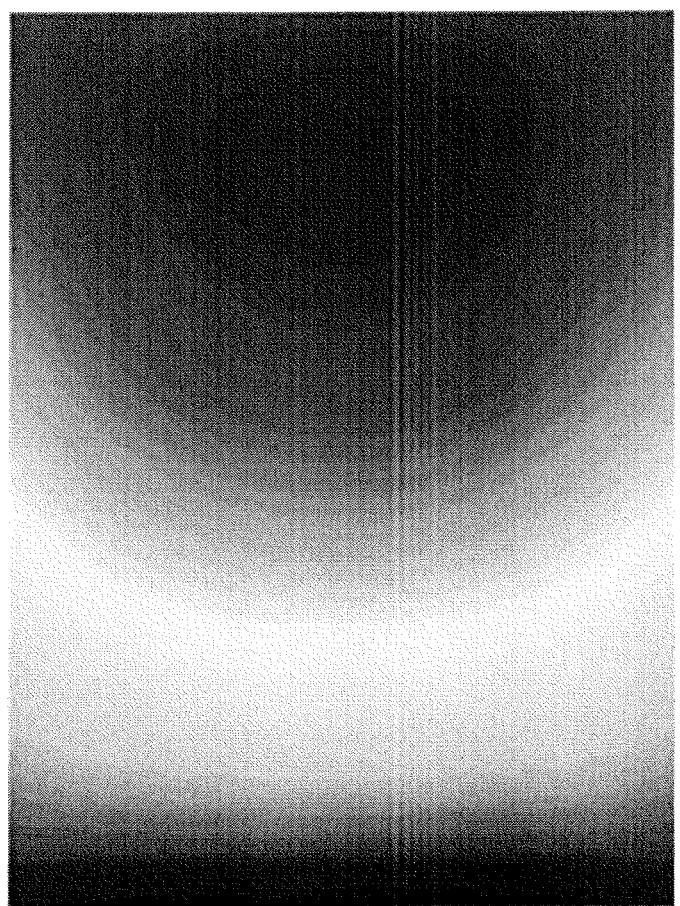
FIG. 9 shows a result of simulation testing of a voltage drop of a second power-supply voltage in a display device according to an exemplary embodiment of the present invention.
Figure 9:
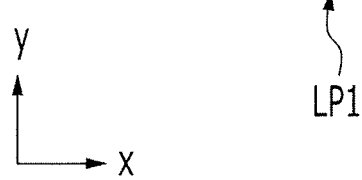

FIG. 9 shows a result of simulation testing of the voltage drop of the second power-supply voltage in a display device according to an exemplary embodiment of the present invention. FIG. 9 shows a measurement result of a level of the second power-supply voltage in the entire portion of the display region 120.

Referring to FIG. 9, it can be seen that the level of the second power-supply voltage is low in a region LP1 where the sixth path wires 161 and 161' are disposed, and the level of the second power-supply voltage increases further away from the region LP1 where the sixth path wires 161 and 161' are disposed. Since the seventh path wire 162 is disposed along the outer circumference of the display region 120, the minimum level of the second power-supply voltage is presented in the display region 120.

The voltage drop of the second power-supply voltage, as a difference between the maximum level and the minimum level, was measured to be about 2.8497 V.

Figure 10:
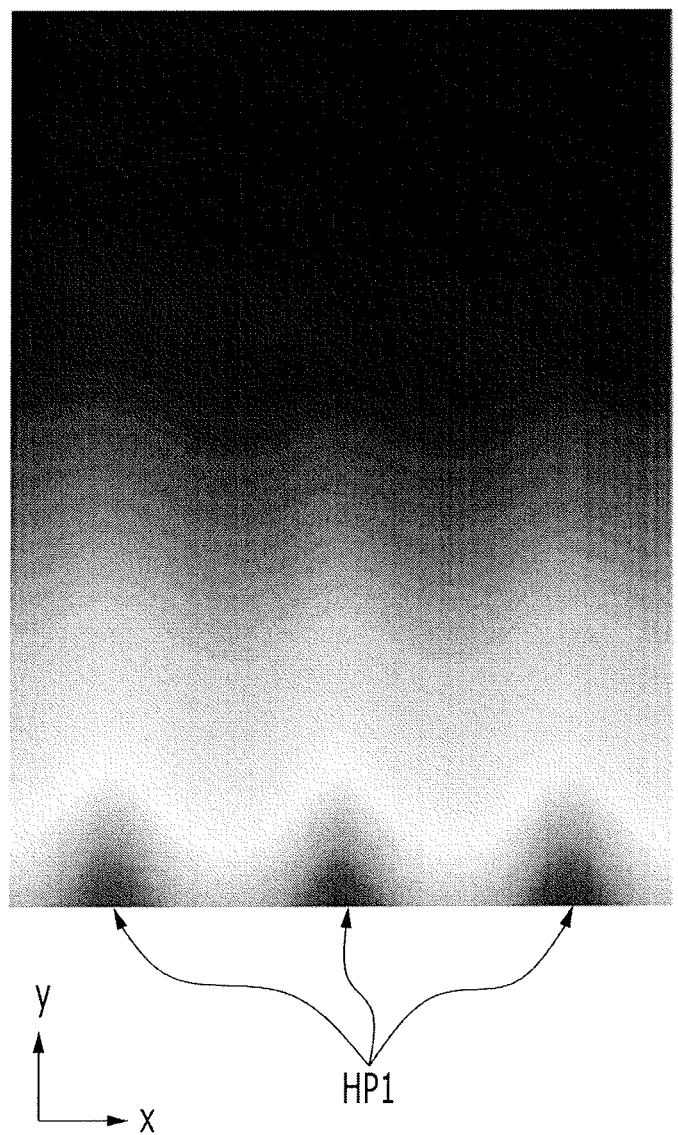
FIG. 10 shows a result of simulation testing of a luminance deviation in a display device according to an exemplary embodiment of the present invention.

FIG. 10 shows a result of a simulation testing the luminance deviation of a display device according to an exemplary embodiment of the present invention. FIG. 10 shows a result of measuring luminance in the entire portion of the display region 120.

Referring to FIG. 10, it can be seen that the luminance is high in the region HP1 where the first path wire 151 and the second path wires 152 and 152' are disposed, and the luminance decreases further away from the region HP1 where the first path wire 151 and the second path wires 152 and 152' are disposed.

The luminance around the center of the display region 120 was measured as about 358.77 cd/cm$^2$, a maximum luminance was measured as about 458.28 cd/cm$^2$, a minimum luminance was measured as about 336.32 cd/cm$^2$, and uniformity of the luminance was evaluated as about 79.27%.

Figure 11:
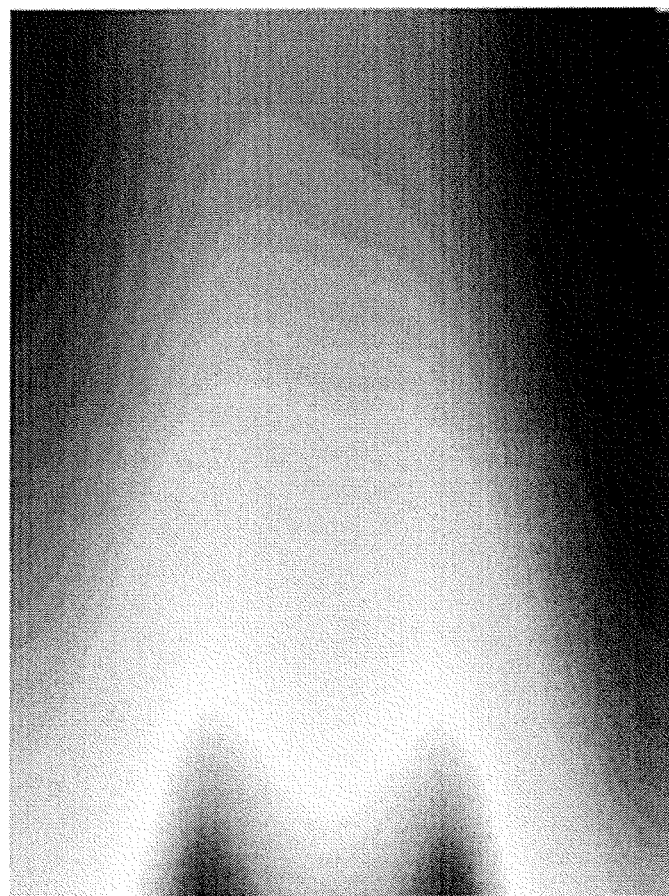
FIG. 11 shows a result of simulation testing of a voltage drop of a first power-supply voltage in a display device according to a comparative example.

FIG. 11 is a drawing showing a result of simulation testing of the voltage drop of the first power-supply voltage in a display device according to a comparative example.

Referring to FIG. 11, the voltage drop of the first power-supply voltage, as a difference between the maximum level and the minimum level, was measured as about 0.2455 V. In comparison with FIG. 8, because of an absence of the first path wire 151, the voltage drop of the first power-supply voltage of the display device of FIG. 11 is a larger value.

Figure 12:
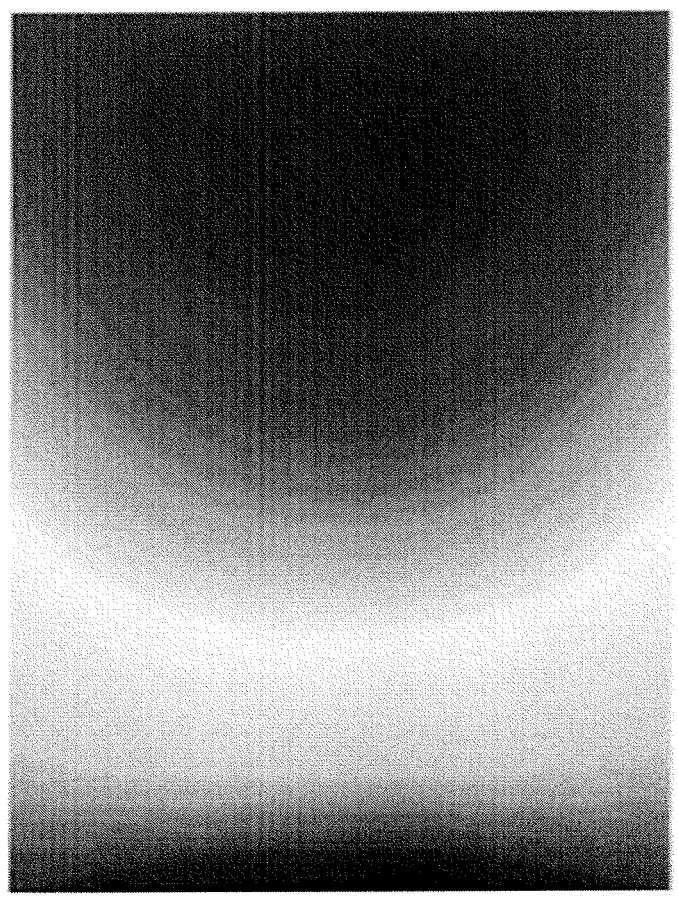
FIG. 12 shows a result of simulation testing of a voltage drop of a second power-supply voltage in a display device according to a comparative example.
Figure 12:
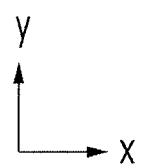

FIG. 12 shows a result of simulation testing of the voltage drop of the second power-supply voltage in a display device according to a comparative example.

Referring to FIG. 12, the voltage drop of the first power-supply voltage, as a difference between a maximum level and a minimum level, was measured to be about 2.9870 V. In comparison with FIG. 9, because the second power wires 160 are disposed to not cross the driving IC region 140, the voltage drop of the second power-supply voltage of the display device of FIG. 12 is a larger value.

Figure 13:
FIG. 13 shows a result of simulation testing of a luminance deviation in a display device according to a comparative example.
Figure 13:
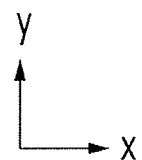

FIG. 13 shows a result of simulation testing of the luminance deviation in a display device according to a comparative example.

Referring to FIG. 13, the luminance around the center of the display region 120 was measured as about 341.96 cd/cm$^2$, the maximum luminance was measured as about 458.78 cd/cm$^2$, the minimum luminance was measured as about 288.42 cd/cm$^2$, and the uniformity of the luminance was evaluated as about 73.80%. In comparison with FIG. 10, the uniformity of the luminance has a lower value.

As it can be seen in the above-described simulation results, by disposing the first power wires 150 and the second power wires 160 in the driving IC region 140, according to an exemplary embodiment of the present invention, the voltage drops of the first power-supply voltage and the second power-supply voltage may be decreased, and the uniformity of the luminance may be increased. Accordingly, a display quality of a display device arranged in accordance with an exemplary embodiment of the present invention can be increased. Further, as the voltage drops of the first power-supply voltage and the second power-supply voltage are reduced, a voltage difference between the first power-supply voltage and the second power-supply voltage may be decreased. Accordingly, a power consumption of a display device arranged in accordance with an exemplary embodiment of the present invention can be decreased.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display device, comprising:
   a plurality of pixels;
   a driving integrated circuit (IC) configured to generate a data voltage for driving the pixels;
   a display substrate including a display region in which the pixels are disposed and a driving IC region in which the driving IC is disposed; and
   a first power wire passing below the driving IC, wherein the first power wire is separated from the driving IC by a difference in height between the first power wire and an IC body support, the first power wire transmits a first power-supply voltage for driving the pixels, and an insulating layer is disposed between the driving IC and the first power wire so that the first power wire is not electrically connected to the driving IC.

2. The display device of claim 1, wherein the first power wire is extended from an outer circumference of the display substrate toward the display region to cross the driving IC region.

3. The display device of claim 1, wherein, in plan view, the display substrate includes two short sides which face each other and two long sides which face each other, and the driving IC region is disposed adjacent to one of the two short sides.

4. The display device of claim 3, further comprising:
   a pad unit disposed on one of the two short sides on which the driving IC region is disposed.

5. The display device of claim 4, wherein the first power wire includes:
   a first path wire connected to the pad unit and extended from the pad unit in a first direction to cross the driving IC region;
   a second path wire connected to the pad unit and extended from the pad unit in the first direction, wherein the second path wire does not cross the driving IC region; and
   a third path wire extended between the display region and the driving IC region in a second direction, wherein the third path wire is connected to the first path wire and the second path wire.

6. The display device of claim 5, wherein the first power wire further includes:
   a plurality of fourth path wires extended from the display region in the first direction and connected to the third path wire; and
   a plurality of fifth path wires extended from the display region in the second direction and connected to the fourth path wires.

7. The display device of claim 5, further comprising:
a second power wire overlapping the driving IC region, wherein the second power wire is insulated from the driving IC, and the second power wire transmits a second power-supply voltage to drive the pixels.

8. The display device of claim 7, wherein the second power wire includes a sixth path wire connected to two first connections of the pad unit, wherein the sixth path wire is disposed adjacent to a wiring path including the first path wire, the third path wire, and the second path wire.

9. The display device of claim 8, wherein the sixth path wire crosses the driving IC region adjacent to the first path wire.

10. The display device of claim 9, wherein the driving IC includes:
   a plurality of input bumpers arranged in the second direction;
   a plurality of output bumpers arranged in the second direction; and
   an IC body disposed on the display substrate to be supported by the input bumpers and the output bumpers,
   wherein the IC body includes a data line region and a power line region in the second direction, the input bumpers and the output bumpers are disposed in the data line region, and the power line region corresponds to a region in which the first path wire and the sixth path wire are disposed.

11. The display device of claim 10, wherein the first path wire and the sixth path wire have a lower height than a height between the IC body and the display substrate.

12. The display device of claim 11, wherein the insulating layer covers the first path wire and the sixth path wire.

13. The display device of claim 8, wherein the second power wire further includes a seventh path wire connected to two second connections of the pad unit, wherein the seventh path wire is disposed along an outer circumference of the display region.

14. A display device, comprising:
   a display substrate;
   a first power wire disposed on the display substrate;
   a plurality of input bumpers disposed on the display substrate;
   a plurality of output bumpers disposed on the display substrate;
   an integrated circuit (IC) body disposed on the first power wire and supported by the input bumpers and the output bumpers;
   a first power input bumper connected to the first power wire;
   a first power output bumper connected to the first power wire;
   a first power connection wire disposed under or in the IC body to connect the first power input bumper and the first power output bumper; and
   a second power wire disposed on the display substrate, wherein the IC body is disposed on the second power wire,
   wherein a first height between the IC body and the display substrate corresponds to a height of the input bumpers and the output bumpers,
   a second height of the first power wire and the second power wire is lower than the first height between the IC body and the display substrate, and
   the first power wire and the second power wire are separated from the IC body by a height difference of the first height and the second height.

15. The display device of claim 14, further comprising:
   an insulating layer covering the first power wire and the second power wire, wherein the insulating layer insulates the first power wire, the second power wire, and the IC body from each other.

16. The display device of claim 14, further comprising:
   a second power input bumper connected to the second power wire;
   a second power output bumper connected to the second power wire; and
   a second power connection wire disposed under or in the IC body to connect the second power input bumper and the second power output bumper.

17. The display device of claim 16, wherein the first power wire is disconnected in a region between the first power input bumper and the first power output bumper, and the second power wire is disconnected in a region between the second power input bumper and the second power output bumper.

18. A display device, comprising:
   a plurality of pixels;
   a driving integrated circuit (IC) configured to generate a data voltage for driving the pixels;
   a display substrate including a display region and a driving IC region, wherein the pixels are disposed in the display region and the driving IC is disposed in the driving IC region; and
   a first power wire passing below the driving IC from a first side of the driving IC region to a second side of the driving IC region that is opposite to the first side, wherein the first power wire is separated from the driving IC by a difference in height between the first power wire and a bumper, the first power wire transmits a first power-supply voltage for driving the pixels, the first power wire is overlapped with an insulating layer so that it is not electrically connected to the driving IC, and the insulating layer is disposed between the driving IC and the first power wire.

* * * * *